(12) United States Patent
Saijou et al.

(10) Patent No.: US 7,902,717 B2
(45) Date of Patent: Mar. 8, 2011

(54) BOUNDARY ACOUSTIC WAVE DEVICE AND METHOD FOR MANUFACTURING THE SAME

(75) Inventors: Shin Saijou, Yasu (JP); Toshiyuki Fuyutsume, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 57 days.

(21) Appl. No.: 12/412,446

(22) Filed: Mar. 27, 2009

(65) Prior Publication Data
US 2009/0179521 A1 Jul. 16, 2009

Related U.S. Application Data

(63) Continuation of application No. PCT/JP2007/064323, filed on Jul. 20, 2007.

(30) Foreign Application Priority Data

Sep. 29, 2006 (JP) .................................. 2006-267805

(51) Int. Cl.
*H01L 41/083* (2006.01)
(52) U.S. Cl. .............. 310/313 R; 310/313 A; 310/313 B
(58) Field of Classification Search .............. 310/313 A, 310/313 R, 313 B; 333/186, 193; *H03H 9/25*
See application file for complete search history.

(56) References Cited

U.S. PATENT DOCUMENTS

| 2006/0071579 A1 | 4/2006 | Kando |
| 2007/0007852 A1 | 1/2007 | Kando |
| 2008/0290968 A1* | 11/2008 | Yamamoto et al. ........... 333/193 |

FOREIGN PATENT DOCUMENTS

| EP | 1610460 | * 12/2005 |
| JP | 02-278909 A | 11/1990 |
| JP | 10-145167 A | 5/1998 |
| JP | 10-335974 A | 12/1998 |
| JP | 2005-005763 A | 1/2005 |

OTHER PUBLICATIONS

Official Communication issued in International Patent Application No. PCT/JP2007/064323, mailed on Oct. 2, 2007.
Cullen et al.; "Surface and interface acoustic waves in SiO2/YX-LiNbO3," American Institute of Physics, Appl. Phys. Lett. 44(2), Jan. 15, 1984, pp. 182-184.

* cited by examiner

*Primary Examiner* — Walter Benson
*Assistant Examiner* — Karen Addison
(74) *Attorney, Agent, or Firm* — Keating & Bennett, LLP

(57) ABSTRACT

A boundary acoustic wave device includes a piezoelectric substance, a dielectric substance laminated on the piezoelectric substance, and an electrode film disposed at a boundary between the piezoelectric substance and a dielectric substance, the device utilizing a boundary acoustic wave propagating along the boundary, wherein the electrode film is any one Au alloy electrode film of an Au alloy electrode film including Cu at a ratio of about 0.01% to about 4.8% by weight, an Au alloy electrode film including Pd at a ratio of about 0.01% to about 6.8% by weight, and an Au alloy electrode film including Ni at a ratio of about 0.01% to about 3.5% by weight.

3 Claims, 9 Drawing Sheets

BOUNDARY ACOUSTIC WAVE DEVICE AND METHOD FOR MANUFACTURING THE SAME

BACKGROUND OF THE INVENTION

1. Field of the Invention

The present invention relates to a boundary acoustic wave device utilizing boundary acoustic waves propagating at a boundary between a piezoelectric substance and a dielectric substance and a method for manufacturing the same. More specifically, the present invention relates to a boundary acoustic wave device including an electrode film disposed between a piezoelectric substance and a dielectric substance, the electrode film being made of an Au alloy, and a method for manufacturing the same.

2. Description of the Related Art

Boundary acoustic wave devices have been used as resonators and band-pass filters. A boundary acoustic wave device includes an IDT electrode that is disposed at a boundary between a first medium and a second medium. The boundary acoustic wave device uses boundary acoustic waves propagating along the boundary. Therefore, the boundary acoustic wave device can be mechanically supported on a surface opposite to the boundary between the first and second media. Therefore, a package structure can be simplified and miniaturized.

An example of such a boundary acoustic wave device is disclosed in WO2004/070946. WO2004/070946 discloses that an IDT electrode is configured using Au, Ag, Cu, or Al, or an alloy thereof. WO2004/070946 also describes that in order to enhance electric power resistance, a second electrode layer made of a metallic material such as Ti, Cr, or NiCr may be laminated on at least one of the surfaces of an electrode layer made of Au, Ag, Cu, or Al, or an alloy thereof. However, WO2004/070946 only shows in specific examples IDT electrodes that include an electrode layer made of Au and Ti layers provided above and below the electrode layer, but no specific examples using other materials.

In a boundary acoustic wave device, acoustic waves propagate not only in a piezoelectric substance but also in the IDT disposed at a boundary between a piezoelectric substance and a dielectric layer. Therefore, a large stress is applied to an IDT electrode. Thus, a boundary acoustic wave device has a problem of low electric power resistance as compared to surface acoustic wave devices.

WO2004/070946 discloses that in the boundary acoustic wave device, the electric power resistance is enhanced by laminating the Ti layers above and below the electrode layer made of Au.

However, the structure in which the Ti layers are laminated above and below the electrode layer made of Au does not have sufficient electric power resistance, and further improvements in the electric power resistance have been required.

Furthermore, in a boundary acoustic wave device, there has been an unmet significant demand for not only enhancing electric power resistance but also decreasing insertion loss.

SUMMARY OF THE INVENTION

To overcome the problems described above, preferred embodiments of the present invention provide a boundary acoustic wave device having low loss in which electric power resistance is enhanced, and a method for manufacturing the device.

A preferred embodiment of the present invention provides a boundary acoustic wave device including a piezoelectric substance, a dielectric substance laminated on the piezoelectric substance, and an electrode film disposed at a boundary between the piezoelectric substance and a dielectric substance, the device utilizing a boundary acoustic wave propagating along the boundary. In the boundary acoustic wave device, the electrode film is any one of an Au alloy electrode film including Cu at a ratio of about 0.01% to about 4.8% by weight, an Au alloy electrode film including Pd at a ratio of about 0.01% to about 6.8% by weight, and an Au alloy electrode film including Ni at a ratio of about 0.01% to about 3.5% by weight.

The term "an Au alloy electrode film including Cu at a ratio of about 0.01% to about 4.8% by weight" represents that an Au alloy electrode film includes Cu at a ratio of about 0.01% to about 4.8% by weight relative to a total of 100% by weight of the Au alloy electrode film. The expression "including Pd at a ratio of about 0.01% to about 6.8% by weight" and the expression "including Ni at a ratio of about 0.01% to about 3.5% by weight" represent the same as the Cu described above.

The electrode film is preferably any one of an Au alloy electrode film including Cu at a ratio of about 0.0% to about 1.7% by weight, an Au alloy electrode film including Pd at a ratio of about 0.01% to about 2.5% by weight, and an Au alloy electrode film including Ni at a ratio of about 0.01% to about 1.0% by weight, for example. In this case, the insertion loss can be further decreased. In other words, although Cu, Pd, or Ni which has higher electric resistance than Au is included, the insertion loss can be further decreased as compared to a case in which pure Au is used.

A method for manufacturing a boundary acoustic wave device according to a preferred embodiment of the present invention includes a step of depositing an Au alloy film on a piezoelectric substance by one of a DC sputtering method, a RF sputtering method, and an electron beam evaporation method, for example, and a step of laminating a dielectric substance on the piezoelectric substance on which the Au alloy film has been deposited. When the Au alloy film is deposited, one of an Au alloy including Cu at a ratio of about 0.01% to about 4.8% by weight, an Au alloy including Pd at a ratio of about 0.01% to about 20.0% by weight, and an Au alloy including Ni at a ratio of about 0.01% to about 10.5% by weight or two elemental metals prepared at a ratio corresponding to any one of the Au alloy compositions are preferably used, for example.

A boundary acoustic wave device according to a preferred embodiment of the present invention includes an electrode film disposed at a boundary between a piezoelectric substance and a dielectric substance, the electrode film preferably being one of an Au alloy electrode film including Cu at a ratio of about 0.01% to about 4.8% by weight, an Au alloy electrode film including Pd at a ratio of about 0.01% to about 20.0% by weight, and an Au alloy electrode film including Ni at a ratio of about 0.01% to about 10.5% by weight, for example. As shown using experimental examples which will be described below, it is possible to enhance the electric power resistance of the boundary acoustic wave device without degrading an insertion loss. Consequently, a boundary acoustic wave device having excellent electric power resistance and reliability can be provided.

A method for manufacturing a boundary acoustic wave device according to a preferred embodiment of the present invention includes a step of depositing an Au alloy film on a piezoelectric substance by a DC sputtering method, a RF sputtering method, or an electron beam evaporation method, for example. In this step, any one of an Au alloy including Cu at a ratio of about 0.01% to about 4.8% by weight, an Au alloy including Pd at a ratio of about 0.01% to about 20.0% by weight, and an Au alloy including Ni at a ratio of about 0.01% to about 10.5% by weight or two elemental metals prepared at a ratio corresponding to any one of the Au alloy compositions are used as a raw material, i.e., a target in the sputtering method or an evaporation source in the electron beam evaporation method. Therefore, in the Au alloy electrode film, the content of Cu, Pd, or Ni is within one of the ranges described above. Thus, a boundary acoustic wave device according to a preferred embodiment of the present invention having excellent electric power resistance can be provided. In addition, a boundary acoustic wave device according to a preferred embodiment of the present invention can be easily and securely manufactured only by controlling the composition of an Au alloy prepared as a target in the sputtering method or an evaporation source in the electron beam evaporation method or only by controlling the ratio of two elemental metals.

As disclosed in U.S. Patent Application Publication No. 2008/0290968, one of the inventors of the present patent application previously developed a method of forming an Au—Ni alloy layer by forming a laminated film made of Ti/Ni/Au/Ni/Ti on a piezoelectric substance and then diffusing Ni into Au by heating. In U.S. Patent Application Publication No. 2008/0290968, Ni is diffused into Au by heating, thereby enhancing the hardness of an electrode film. The method described in U.S. Patent Application Publication No. 2008/0290968 is capable of easily controlling the composition as compared to using an alloy from the beginning. However, it is necessary to precisely control a heating process in order to control diffusion in order to obtain an optimum composition. In addition, heat and electric energy are applied, and thus, Ni diffusion further proceeds, thereby possibly deviating from an optimum composition.

In contrast, in the manufacturing method according to various preferred embodiments of the present invention, the Au alloy film is formed by a DC sputtering method, a RF sputtering method, or an electron beam evaporation method, for example, using an Au alloy as a raw material from the beginning. Therefore, the Au alloy film with a target composition can be easily and securely formed without deviating from an optimum composition.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

A preferred embodiment of the present invention is described with reference to the drawings.

Example 1

Figure 1A:
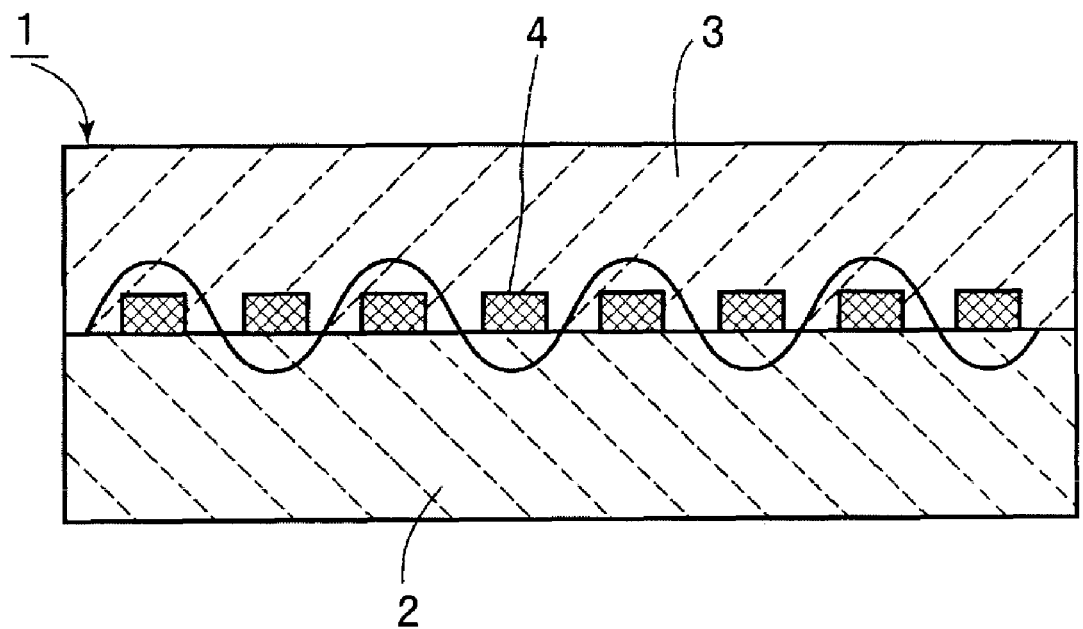
FIG. 1A is a schematic front sectional view and FIG. 1B is a schematic enlarged front sectional view showing an electrode structure, for illustrating a boundary acoustic wave filter device according to a preferred embodiment of the present invention.
Figure 1B:
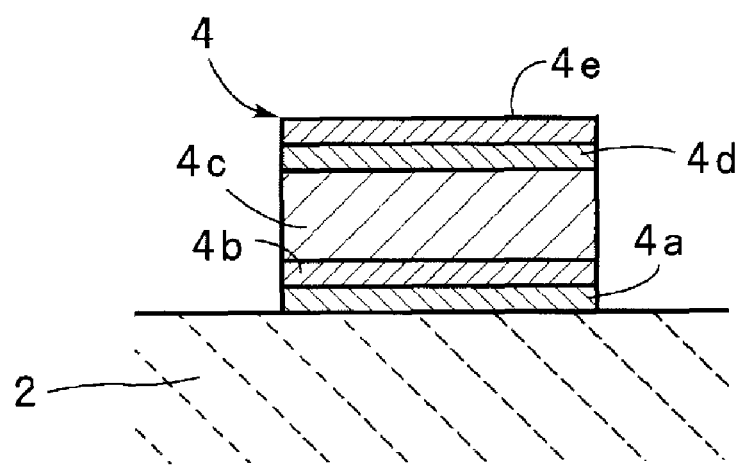
Figure 2:
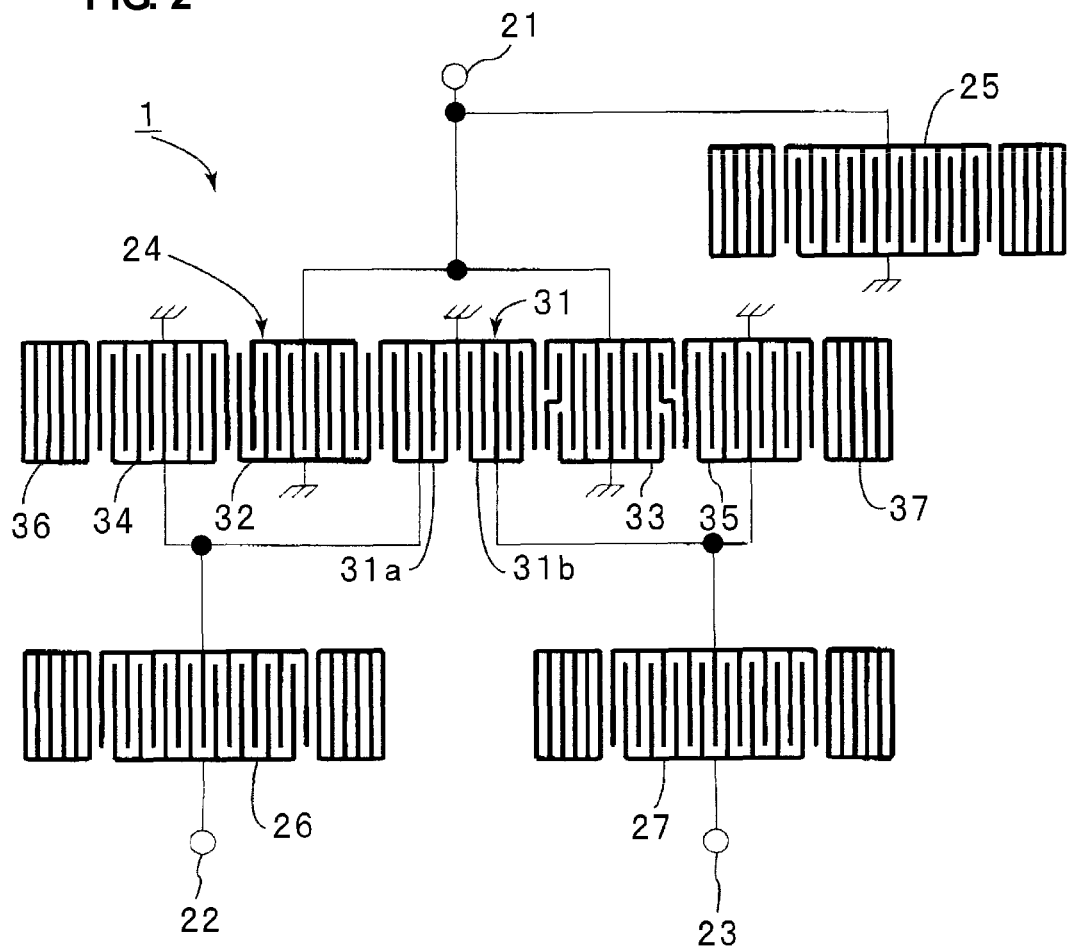
FIG. 2 is a schematic plan view showing an electrode structure of a boundary acoustic wave filter device according to a preferred embodiment of the present invention.

FIG. 1A is a schematic front sectional view, FIG. 1B is a schematic enlarged front sectional view showing an electrode structure, and FIG. 2 is a plan view showing the electrode structure, for illustrating a boundary acoustic wave filter device according to a preferred embodiment of the present invention.

A boundary acoustic wave filter device 1 of this preferred embodiment includes a piezoelectric substance 2 and a dielectric substance 3 laminated on the piezoelectric substance 2. As the piezoelectric substance 2, a 15° Y-cut X-propagating $LiNbO_3$ single crystal substrate is preferably used, for example. The dielectric substance 3 is preferably made of $SiO_2$, for example. In addition, an electrode film 4 including an IDT is disposed at the boundary between the piezoelectric substance 2 and the dielectric substance 3, i.e., on the upper surface of the piezoelectric substance 2.

As the electrode film 4, an IDT and a longitudinally coupled resonator filter portion having a short-circuited grating reflector are provided. In this manner, the longitudinally coupled resonator-type boundary acoustic wave filter device 1 having a pass band in a 900 MHz band was manufactured as Example 1.

The boundary acoustic wave filter device 1 of this preferred embodiment has an electrode structure defined by the electrode film 4 as shown in a schematic plan view of FIG. 2. As shown in FIG. 2, a five-IDT type longitudinally coupled resonator type boundary acoustic wave filter portion 24 is connected between an unbalanced terminal 21 and first and second balanced terminals 22 and 23. The longitudinally coupled resonator-type boundary acoustic wave filter portion 24 includes a first IDT 31 disposed at the approximate center, second and third IDTs 32 and 33 disposed on both sides of the first IDT 31 in the boundary wave propagation direction, fourth and fifth IDTs 34 and 35 disposed on both sides of a region in which the first to third IDTs 31 to 33 are disposed in the boundary wave propagation direction, and reflectors 36 and 37. First ends of the second and third IDTs 32 and 33 are commonly connected to the unbalanced terminal 21. In addition, a one-port boundary acoustic wave resonator 25 is connected between the unbalanced terminal 21 and a ground potential. Second ends of the second and third IDTs 32 and 33 are connected to a ground potential.

The first IDT 31 at the approximate center is divided into two portions in the boundary wave propagation direction so as to provide first and second divided IDT portions 31a and 31b. Ends of the divided IDT portions 31a and 31b are electrically connected to each other with a common bus bar and are connected to the ground potential. The other end of the first divided IDT portion 31a and an end of the fourth IDT 34 are commonly connected to the first balanced terminal 22 through a one-port boundary acoustic wave resonator 26. The other end of the fourth IDT 34 is connected to the ground potential.

The other end of the second divided IDT portion 31b opposite to the side connected to the ground potential and an end of the fifth IDT 35 are commonly connected to the second balanced terminal 23 through a one-port boundary acoustic wave resonator 27. The other end of the fifth IDT 35 is connected to the ground potential. Therefore, a filter device having a balanced-unbalanced conversion function is provided using the longitudinally coupled resonator-type boundary acoustic wave filter portion 24.

The electrode film 4 was formed by electron beam evaporation, and the dielectric substance 3 made of $SiO_2$ was formed by RF magnetron sputtering.

More specifically, as shown in FIG. 1B, a Ti film 4a, a Pt film 4b, an Au alloy film 4c, a Pt film 4d, and a Ti film 4e were deposited in that order on the piezoelectric substance 2 made of $LiNbO_3$ by electron beam evaporation to form a laminated metal film as the electrode film 4. When depositing the Au alloy film 4c by electron beam evaporation, an Au alloy with a composition including Au and Cu, Pd, or Ni was used as an evaporation source as a raw material. More specifically, an Au alloy including Cu at a ratio of about 1.1% by weight of the total, an Au alloy including Pd at a ratio of about 0.9% by weight of the total, or an Au alloy including Ni at a ratio of about 1.1% by weight of the total was used, for example.

The thickness of the Au alloy film 4c was about 120 nm. The thickness of the Pt films 4b and 4a was about 10 nm, and the thickness of the Ti films 4a and 4e was about 10 nm. The resultant boundary acoustic wave filter device was tested for electric power resistance according to the following procedures.

In an electric power resistance test, a constant voltage was applied by sweeping the entire pass band of the boundary acoustic wave filter device to select a frequency at which the maximum change occurred in the insertion loss. When the change in insertion loss was at least about 0.3 dB, a power value was considered to be a fault electric power used as an index for evaluating the electric power resistance. Therefore, the greater the fault electric power, the higher the electric power resistance.

The results are shown in Table 1 below. For comparison, a boundary acoustic wave filter device was prepared by substantially the same method as described above except that an Au film made of pure Au was used instead of the Au alloy film and evaluated for the fault electric power as described above. The results are shown in Table 1 described below.

TABLE 1

| Film type | Fault electric power (ratio to pure Au) |
|---|---|
| Au—Pd alloy | 1.12 |
| Au—Ni alloy | 1.42 |
| Au—Cu alloy | 1.88 |

As shown in Table 1, when the Au alloy film is used, the fault electric power is increased so as to increase electric power resistance in each of the cases of an Au—Pt alloy, an Au—Ni alloy, and an Au—Cu alloy as compared to the case in which a pure Au film is used. This may be due to the fact that with an Au alloy including Au and Cu, Pd, or Ni, the film hardness is increased as compared to pure Au, thereby suppressing Au migration and increasing electric power resistance.

Next, boundary acoustic wave filter devices were produced by substantially the same method as described above except that Au alloy films 4c including Ni at various ratios were used as the Au alloy film 4c in the boundary acoustic wave filter device 1 of Example 1, and evaluated for electric power resistance. The results are shown in FIG. 3.

Figure 3:
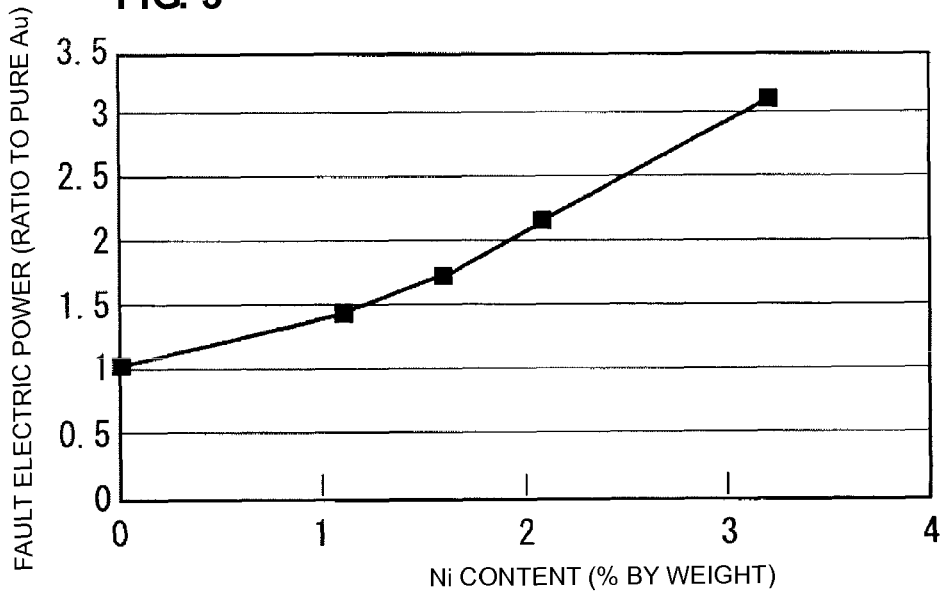
FIG. 3 is a graph showing a relationship between the Ni content in an Au alloy film and the fault electric power as an index for electric power resistance evaluated in Example 1.

FIG. 3 shows that in the Au alloy film formed using an Au—Ni alloy, the electric power resistance is increased as the Ni ratio increases. That is, the hardness of the Au alloy film 4c is increased by increasing the Ni ratio, and thereby the migration suppressing effect is increased.

According to an experiment performed by the inventors of the present invention, it was confirmed that in an Au alloy film including Cu or Pd, the electric power resistance can be further increased by increasing the Cu or Pd content.

The Pt films 4b and 4d disposed above and below the Au alloy film 4c are provided as diffusion prevention layers for preventing diffusion of Au, Cu, Pr, and Ni to the outer Ti films 4a and 4e. In addition, the Ti films 4a and 4e are provided as adhesion layers to enhance adhesion to Si or $LiNbO_3$. In preferred embodiments of the present invention, the Ti films 4a and 4e are not necessarily provided, and the Pt films 4b and 4d are not necessarily provided.

Example 2

Figure 4A:
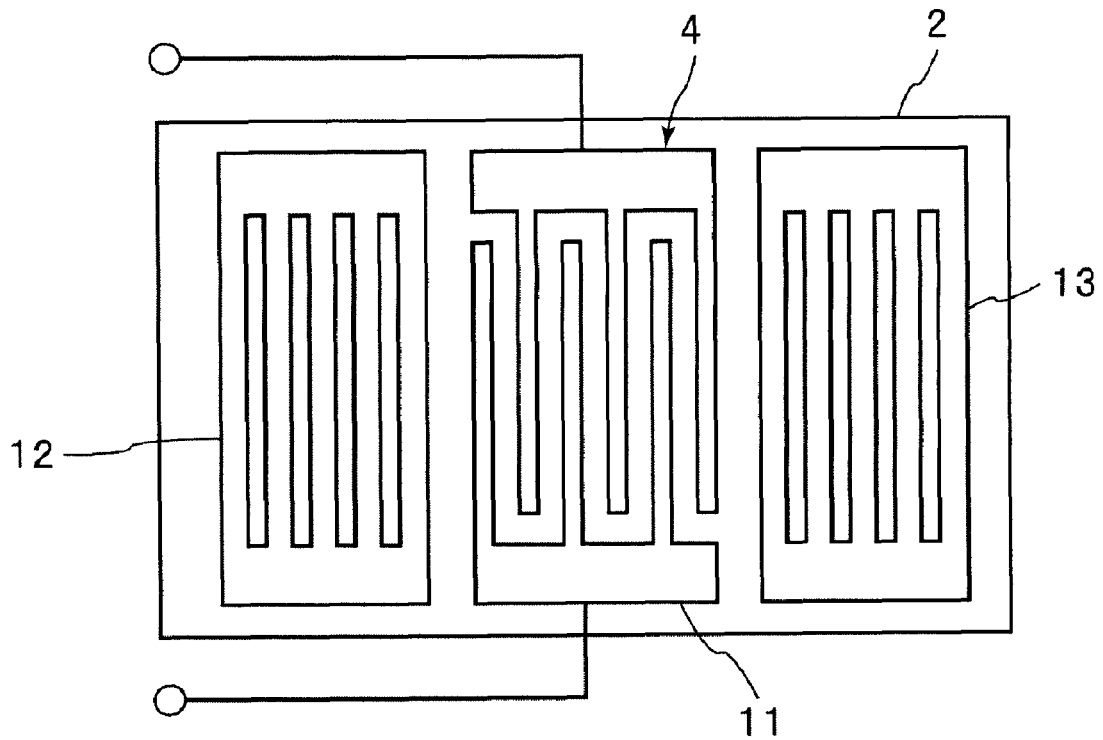
FIG. 4A is a schematic plan view showing an electrode structure of a 1-port boundary acoustic wave resonator prepared in Example 2.

Next, a one-port boundary acoustic wave resonator having an electrode structure shown in FIG. 4A was formed and evaluated. As shown in FIG. 4A, an electrode film 4 is deposited so as to include IDT 11 and reflectors 12 and 13 disposed on both sides of the IDT 11. Although not shown in FIG. 4A, a dielectric substance 3 is laminated to cover the electrode film 4 as in the preferred embodiment shown in FIG. 1A. In this experimental example, a 15° Y-cut X-propagation $LiNbO_3$ single crystal substrate was used as the piezoelectric substance 2. After the electrode film 4 was formed by electron beam evaporation, $SiO_2$ was deposited as the dielectric substance by RF magnetron sputtering.

Figure 4B:
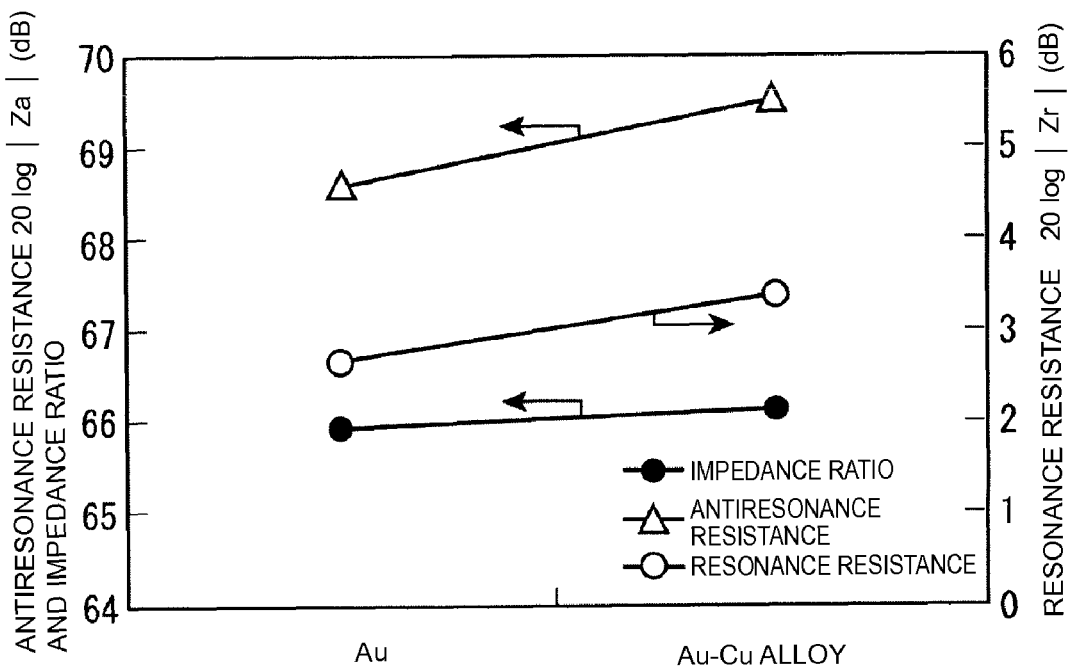
FIG. 4B is a graph showing an impedance ratio, resonance resistance, and antiresonance resistance in Example 2 and Comparative Example 2.

As in the electrode film structure shown in FIG. 1B, in the electrode film 4, the IDT 11 was a laminated metal film of Ta film 4a/Pt film 4b/Au alloy film 4c/Pt film 4d/Ti film 4e. The Au alloy film 4c was deposited by electron beam evaporation using an Au alloy including about 1.1% by weight of Cu as an evaporation source. FIG. 4B shows resonance resistance, antiresonance resistance, and an impedance ratio of the one-port boundary acoustic wave resonator formed as described above. The term "impedance ratio" represents a ratio of impedance at an antiresonance frequency to impedance at a resonance frequency.

FIG. 4B shows the results of the one-port boundary acoustic wave resonator of Example 2 using the Au alloy film and the results of a one-port boundary acoustic wave resonator of Comparative Example 2 formed by substantially the same method as in Example 2, except that a pure Au film was used instead of the Au alloy film.

Figure 5:
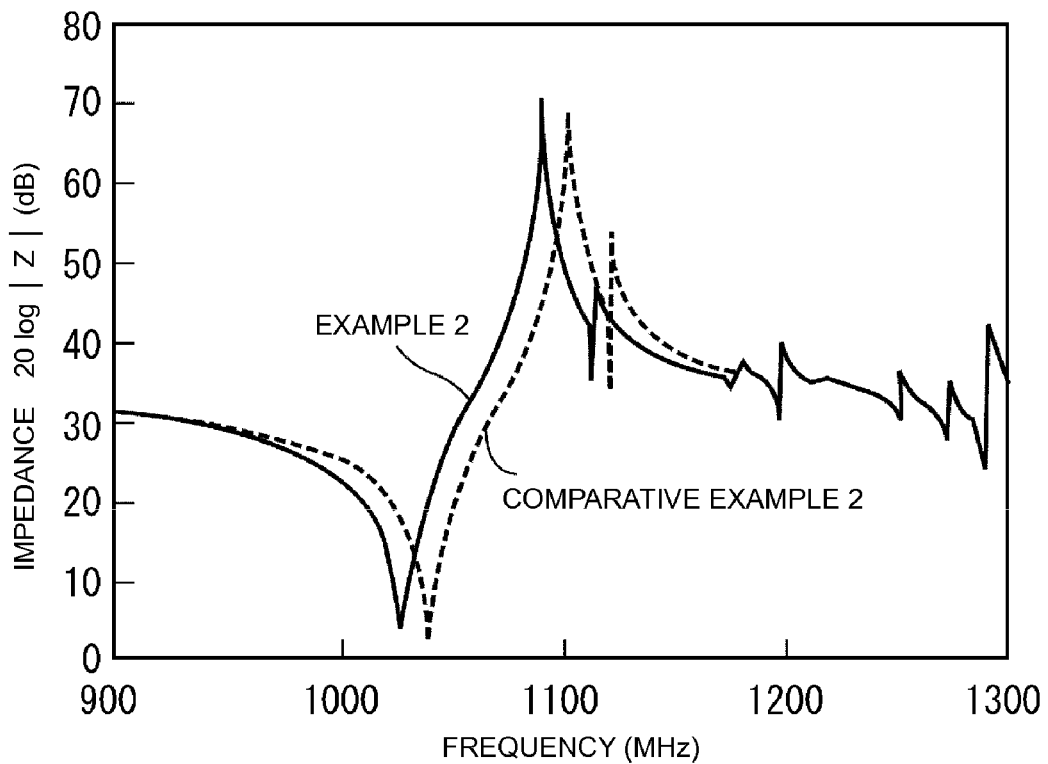
FIG. 5 is a graph showing impedance frequency characteristics in Example 2 and Comparative Example 2.
Figure 6:
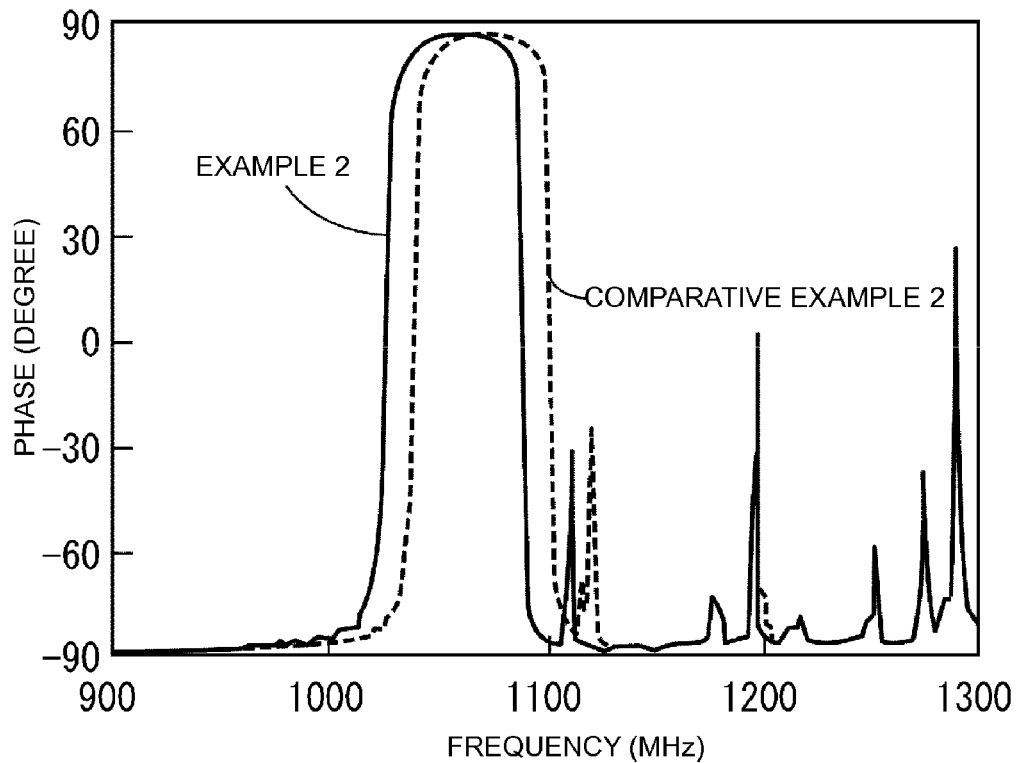
FIG. 6 is a graph showing phase frequency characteristics in Example 2 and Comparative Example 2.

FIG. 5 shows impedance frequency characteristics of the boundary acoustic wave resonators of Example 2 and Comparative Example 2. FIG. 6 shows phase frequency characteristics of the boundary acoustic wave resonators of Example 2 and Comparative Example 2. In each of FIGS. 5 and 6, the results of Example 2 are shown by a solid line, and the results of Comparative Example 2 are shown by a broken line.

FIG. 4B shows that in Example 2, both the resonance resistance and the antiresonance resistance are increased by using the Au alloy film 4c as compared to Comparative Example 2. The resonance resistance is increased due to an increase in electric resistance of the electrode film, and the antiresonance resistance is increased by the damping loss suppressing effect due to an increase in film hardness.

Figure 10:
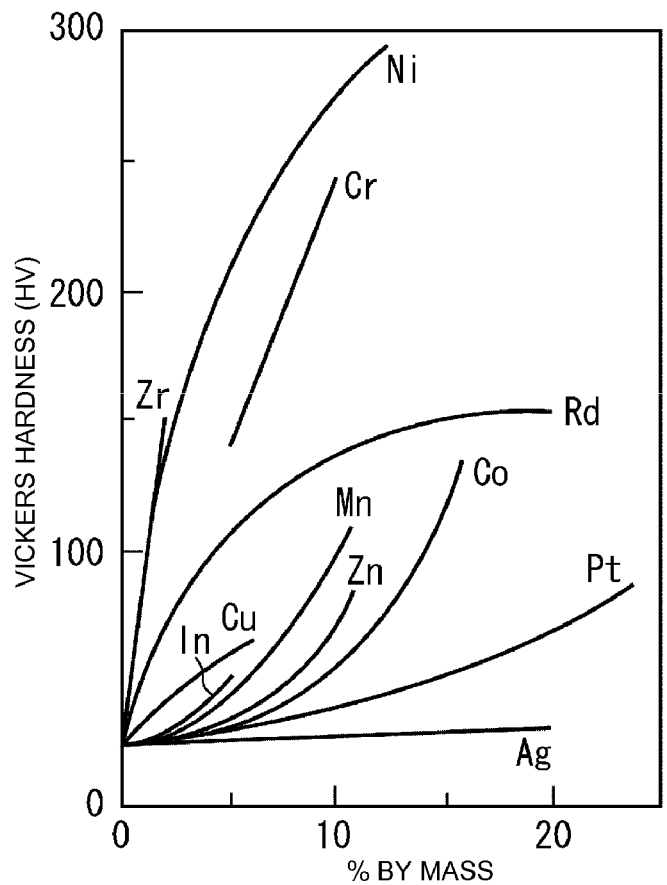
FIG. 10 is a graph showing a relationship between the adding ratios (% by mass) of various metals added to Au and the Vickers hardness of the Au alloys.
Figure 11:
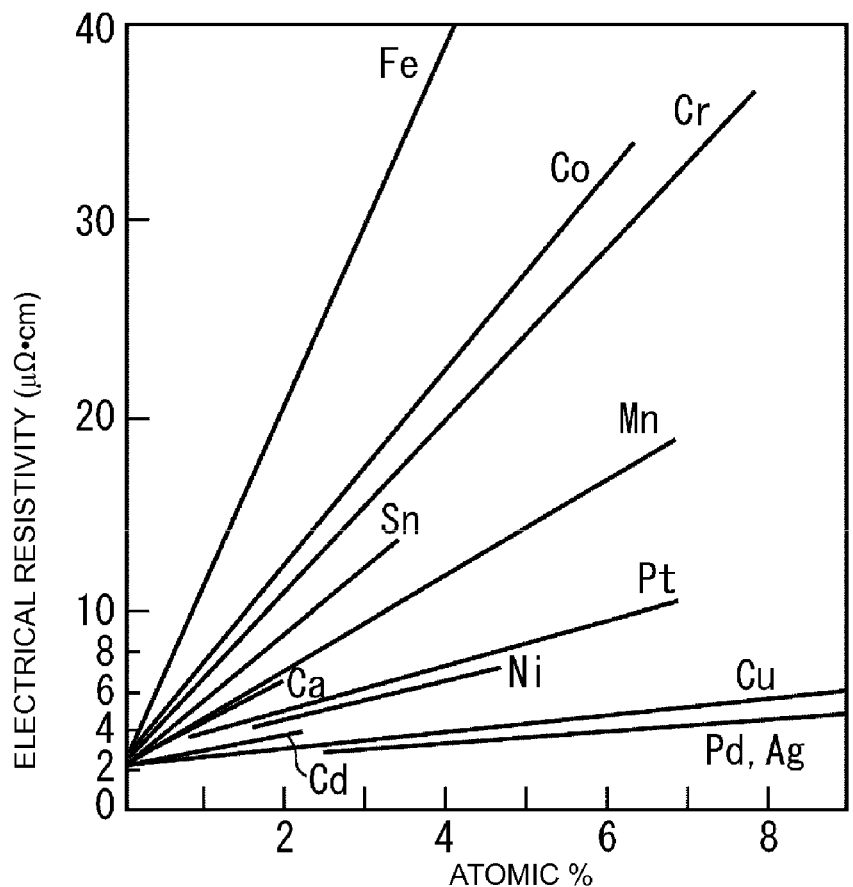
FIG. 11 is a graph showing relationships between the adding ratios (atomic %) of various metals added to Au and electrical resistivity of the Au alloys.

In "Scientific Application of Noble Metal" (edited by Masahito Hongo, Tanaka Kikinzoku Kogyo Co., Ltd.) p. 84, it is disclosed that the hardness of Au can be increased by adding another metal to Au. In other words, as shown in FIGS. 10 and 11, the Vickers hardness of a metal film is increased by adding another metal to Au, and accordingly, electrical resistivity is also increased.

When the Au alloy film 4c formed by adding a small amount of Cu to Au is used as in Example 2, the damping loss decreasing effect due to an increase in the film hardness is may be greater than an internal loss due to an increase in electric resistance of an electrode film. Therefore, as described above, it has been discovered that the impedance ratio of the one-port boundary acoustic wave resonator is greater than that in Comparative Example 2, thereby improving frequency characteristics.

Example 3

For the boundary acoustic wave filter device 1 evaluated with respect to electric power resistance in Example 1, the Cu content in the Cu-including Au alloy film was changed within the range of about 0.01% to about 4.8% by weight to evaluate the relationship between the insertion loss and the Cu content. The results are shown in Table 2 and FIG. 7.

TABLE 2

| Cu content (% by weight) | Insertion loss (dB) |
| --- | --- |
| 0.01 | 1.29 |
| 0.13 | 1.25 |
| 0.18 | 1.19 |
| 0.5 | 1.21 |
| 1 | 1.24 |
| 1.1 | 1.28 |
| 1.2 | 1.23 |
| 1.7 | 1.29 |
| 2.1 | 1.33 |
| 3.8 | 1.49 |
| 4.8 | 1.59 |

Figure 7:
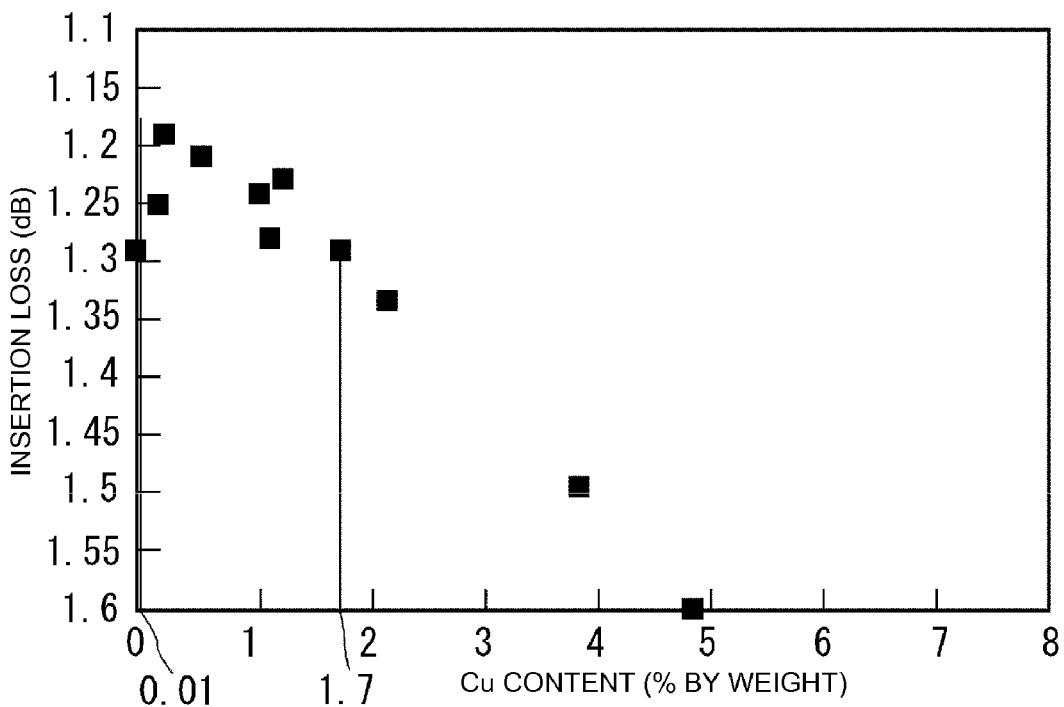
FIG. 7 is a graph showing a relationship between the Cu content and insertion loss of a Cu-including Au alloy film in Example 3.

Table 2 and FIG. 7 show that in an Au alloy film including Cu at a relatively low ratio, the insertion loss is relatively small and improved as compared to the Au alloy film 4c having a Cu content of 0, i.e., pure Au. In particular, at a Cu content within the range of about 0.01% to about 1.7% by weight, the insertion loss is less than that in the pure Au film not including Cu. Therefore, both the electric power resistance and the insertion loss can be improved by using an Au alloy film including Au and Cu at a ratio within the range of about 0.01% to about 1.7% by weight. Therefore, when a Cu-including Au alloy film is used, the Cu content is preferably within the range of about 0.01% to about 1.7% by weight, for example.

When the Cu content is further increased, the insertion loss is slightly degraded. However, even if the insertion loss is increased by about 0.3 dB as compared to the insertion loss of the pure Au film, this value falls in an allowable range of such a RF-stage band-pass filter. Therefore, as shown in FIG. 7, when the Cu content is about 4.8% by weight or less, the insertion loss falls within the allowable range, and the electric power resistance can be increased as compared to the use of a pure Au film because the insertion loss falls within an allowable range. Therefore, when a Cu-including Au alloy film is used, the Cu content can preferably be within the range of about 0.01% to about 4.8% by weight of the total.

Example 4

The Pd content of an Au alloy film including Au and Pd added, instead of Cu, was changed by substantially the same method as in Example 3 to evaluate the insertion loss. The results are shown in Table 3 and FIG. 8.

TABLE 3

| Pd content (% by weight) | Insertion loss (dB) |
| --- | --- |
| 0.01 | 1.29 |
| 0.8 | 1.24 |
| 1.8 | 1.27 |
| 2.5 | 1.29 |
| 3 | 1.32 |
| 4.6 | 1.42 |
| 6.8 | 1.59 |

Figure 8:
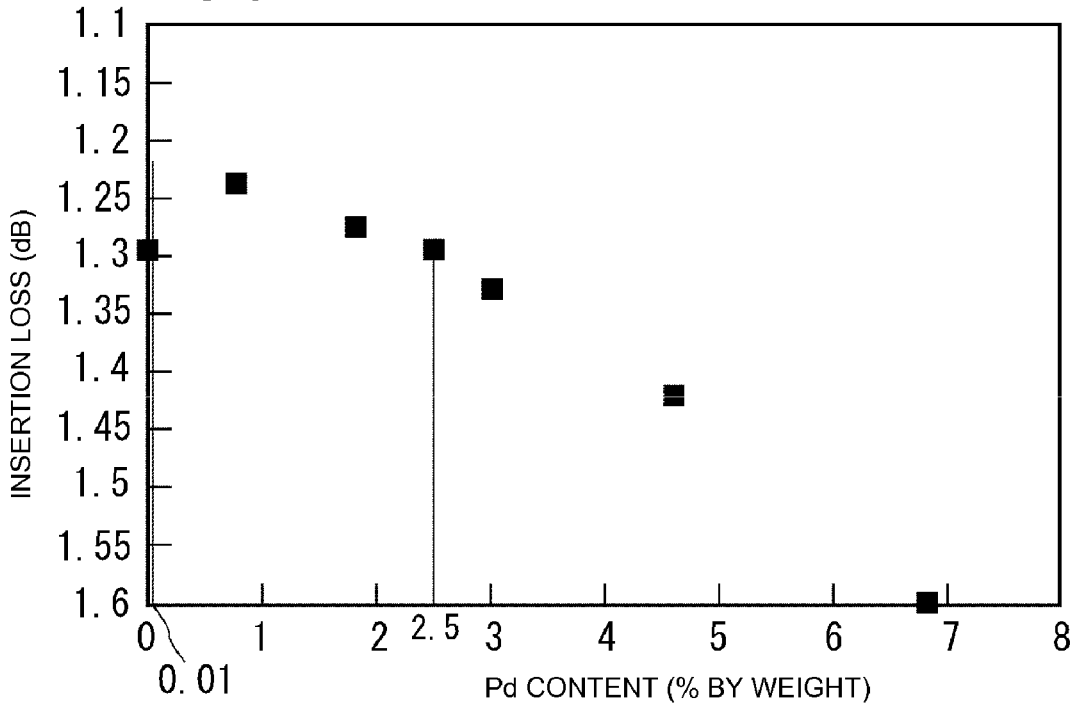
FIG. 8 is a graph showing a relationship between the Pd content and insertion loss of a Pd-including Au alloy film in Example 3.

Table 3 and FIG. 8 show that even when the Pd-including Au alloy film is used, the insertion loss is further decreased by adding a very small amount of Pd as compared to the case of a pure Au film that does not include Pd while the electric resistance is increased. It has also been discovered that when the Pd content is within the range of about 0.01% to about 2.5% by weight, the insertion loss is less than that in the use of a pure Au film. Therefore, the Pd content is preferably within the range of about 0.01% to about 2.5% by weight.

The possible reason that the content range of about 0.01% to about 2.5% by weight in which the insertion loss is degraded by adding Pd is greater than that when Cu is added is that an increase in film resistance due to the addition of Pd is less than an increase in film resistance due to the addition of Cu.

Also, FIG. 8 shows that the Pd content is preferably about 6.8% by weight or less in order to achieve an insertion loss within the allowable range (about 0.3 db) of the insertion loss of a pure Au film. Therefore, when a Pd-including Au alloy film is used, the Pd content is preferably in the range of about 0.01% to about 6.8% by weight of the total.

Example 5

The Ni content of an Au alloy film including Au and Ni added instead of Cu was changed by substantially the same method as in Examples 3 and 4 to evaluate the insertion loss. The results are shown in Table 4 and FIG. 9.

TABLE 4

| Ni content (% by weight) | Insertion loss (dB) |
| --- | --- |
| 0.01 | 1.29 |
| 0.5 | 1.28 |
| 1 | 1.29 |
| 1.1 | 1.3 |
| 1.7 | 1.38 |
| 2.8 | 1.49 |
| 3.5 | 1.59 |

Figure 9:
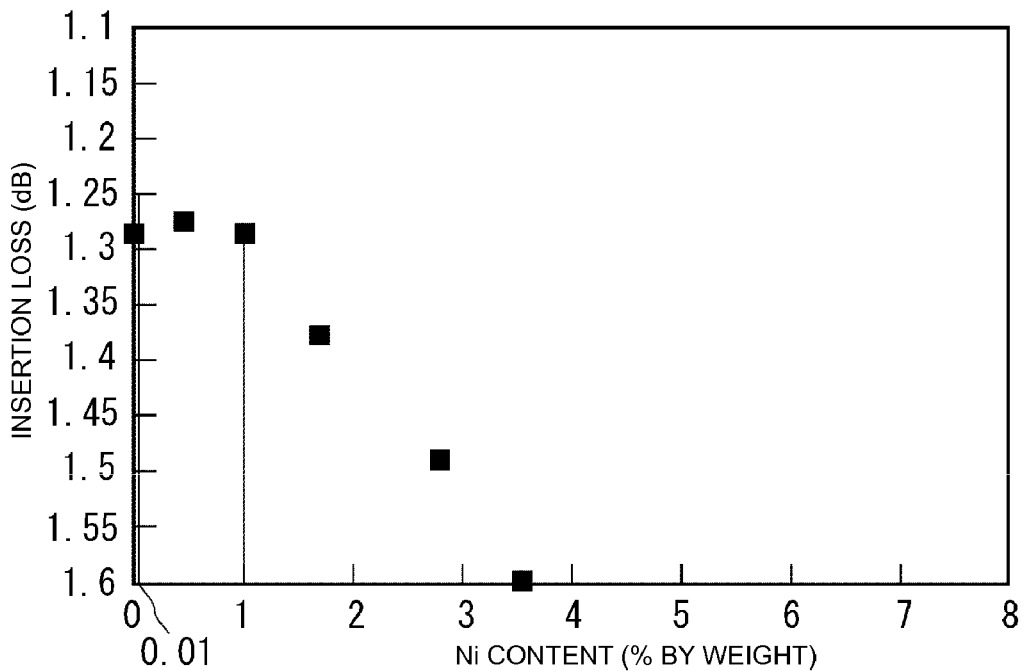
FIG. 9 is a graph showing a relationship between the Ni content and insertion loss of a Ni-including Au alloy film in Example 3.

Table 4 and FIG. 9 show that when a small amount of Ni is added, the insertion loss can be improved as compared to a pure Au film. However, the improvement of the insertion loss is less than those of Cu and Pd. This is possibly because when Ni is added, as shown in FIG. 11, the film resistance is significantly increased as compared to Cu and Pd.

As shown in FIG. 9, when the Ni content is within the range of about 0.01% to about 1.0% by weight, the insertion loss is less than that of a pure Au film. Therefore, both the increased electric power resistance and the lower insertion loss can be achieved. Similar to Example 3, FIG. 8 shows that the Ni content is preferably about 3.5% by weight or less in order to achieve an insertion loss within an allowable range. Therefore, in preferred embodiments of the present invention, when a Ni-including Au alloy film is used, the Ni content is preferably within the range of about 0.01% to about 3.5% by weight, for example.

Although, in Examples 1 to 3, an Au alloy film was formed by the electron beam evaporation method using an evaporation source made of an Au alloy as a raw material, an Au alloy film may preferably be deposited by a DC sputtering method or RF sputtering method using a target made of the Au alloy, for example. In a method other than the method using the evaporation source or target made of an Au alloy, Au and Cu, Pd or Ni may be prepared so as to correspond to the composition of the Au alloy. For example, for sputtering, an Au target and a Cu target, a Pd target, or a Ni target may be provided in amounts corresponding to the composition of the Au alloy. In this case, when a film is deposited by electron beam evaporation or sputtering, the composition of a resultant Au alloy film can be easily and reliably controlled by controlling the composition of a raw material.

According to the experiment performed by the inventors of the present invention, it is confirmed that with the DC sputtering, RF sputtering, or electron beam evaporation, an Au alloy film corresponding to the composition of the raw material used can be reliably formed using as the raw material an Au alloy including about 0.01% to about 4.8% by weight of Cu, an Au alloy including about 0.01% to about 20.0% by weight of Pd, or an Au alloy including about 0.01% to about 10.5% by weight of Ni. This is described with reference to FIGS. 12 to 15.

Figure 12:
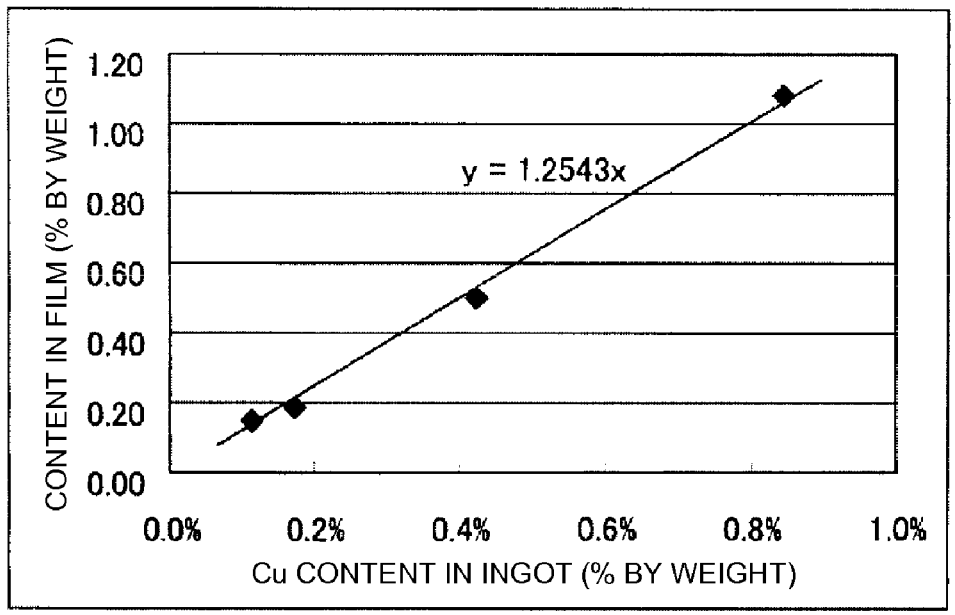
FIG. 12 is a graph showing a relationship between the Cu content in an Au—Cu alloy ingot used as a raw material of electron beam evaporation and the Cu content in an Au—Cu thin film formed by electron beam evaporation.
Figure 13:
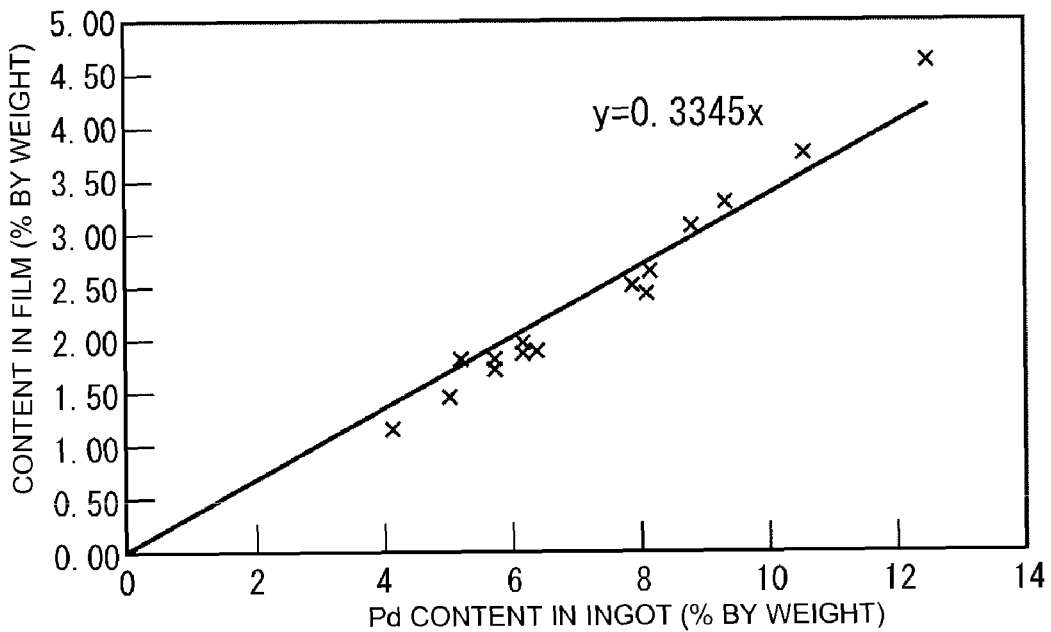
FIG. 13 is a graph showing a relationship between the Pd content in an Au—Pd alloy ingot used as a raw material of electron beam evaporation and the Pd content in an Au—Pd thin film formed by electron beam evaporation.
Figure 14:
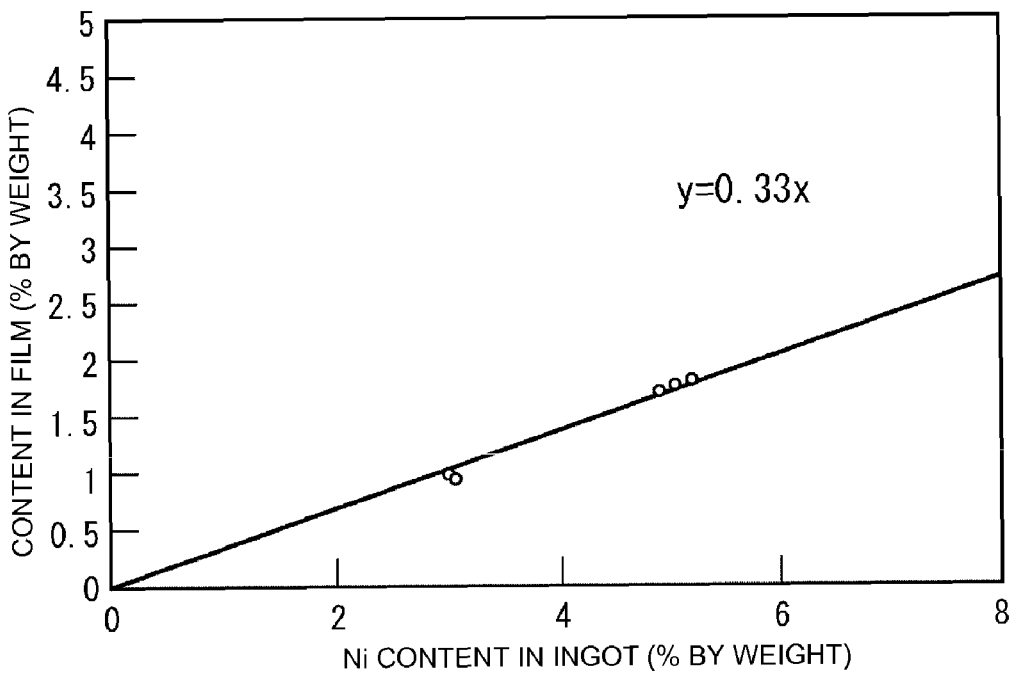
FIG. 14 is a graph showing a relationship between the Ni content in an Au—Ni alloy ingot used as a raw material of electron beam evaporation and the Ni content in an Au—Ni thin film formed by electron beam evaporation.

FIGS. 12 to 14 show relationships between the Cu, Pd, and Ni contents in ingots used as evaporation sources and the Cu, Pd, and Ni contents in the resultant thin films, respectively, formed by electron beam evaporation using the respective ingots of Cu-, Pd-, and Ni-including Au alloys as the evaporation sources.

Figure 15:
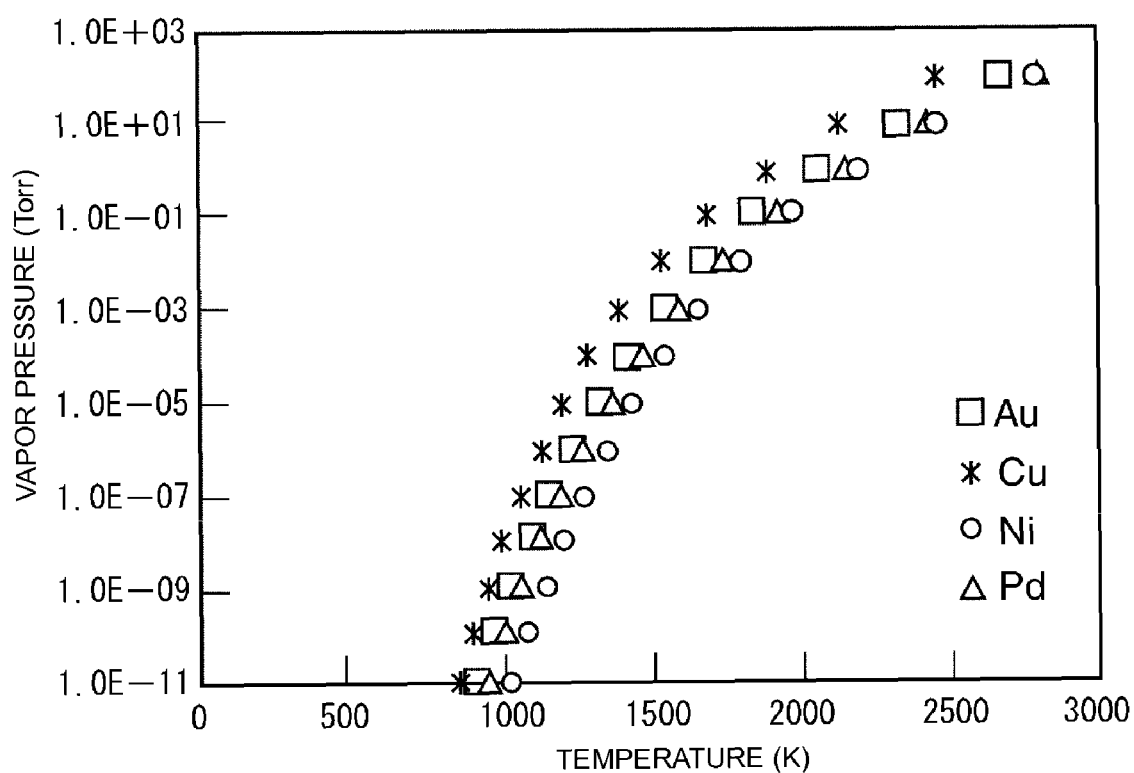
FIG. 15 is a graph showing vapor pressure curves of Cu, Au, Ni, and Pd.

FIGS. 12 to 14 show that the content in the ingot used as the evaporation source has a correlation to the content in the thin film formed by electron beam evaporation, but the correlation is not necessarily constant. This is because as shown in FIG. 15, Au, Cu, and Ni have different vapor pressures with temperatures. That is, as shown by the vapor pressure curves shown in FIG. 15, the order of evaporation is Cu, Au, Pd, and Ni, and thus with an Au—Cu alloy, the Cu content in the thin film formed by electron beam evaporation is equal to or greater than the content in the evaporation source. In contrast, in an AuNi alloy and an AuPd alloy, the Ni content and the Pd content in the respective thin films are less than the Ni content and the Pd content in the respective evaporation sources.

According to an expression obtained from the results shown in FIGS. 12 to 14, therefore, it is preferable to use an Au alloy with a composition including about 0.01% to about 4.8% by weight of Cu, an Au alloy with a composition including about 0.01% to about 20.0% by weight of Pd, or an Au alloy with a composition including about 0.01% to about 10.5% by weight of Ni.

Therefore, in the manufacturing method according to preferred embodiments of the present invention, in the step of depositing an Au alloy film on a piezoelectric substance by any one of the DC sputtering method, the RF sputtering method, and the electron beam evaporation method, any one of the above-described Au alloys having the compositions may preferably be used as a raw material for the Au alloy film, or two types of metals corresponding to the alloy composition, i.e., Au and Cu, Pd, or Ni, may preferably be used for film deposition. After the Au alloy film is deposited, a dielectric substance may preferably be laminated by any appropriate method. As described above, the method for laminating the dielectric substance is not limited to the RF magnetron sputtering performed in Example 1, and the DC sputtering method or the electron beam evaporation method may preferably be used.

Although, in Examples 1 to 3, the Ti films 4a and 4e were preferably formed as the adhesion layers, a metal film having the same or substantially the same function, such as a film of NiCr or Cr, for example, may preferably be formed as the adhesion layer.

Although a Pt film was preferably formed as the diffusion prevention layer, another metal film exhibiting the diffusion prevention effect may preferably be formed instead of the Pt film.

Furthermore, although, in Examples 1 to 3, 15° Y-cut X-propagating LiNbO$_3$ is preferably used as the piezoelectric substance 2, LiNbO$_3$ with another cut angle may preferably be used, or another piezoelectric substance such as LiTaO$_3$ or quartz, for example, may preferably be used.

Furthermore, silicon oxide other than SiO$_2$ may preferably be used as the dielectric substance, or another dielectric material, such as silicon nitride, for example may preferably be used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave device comprising:
   a piezoelectric substance;
   a dielectric substance laminated on the piezoelectric substance; and an electrode film disposed at a boundary between the piezoelectric substance and the dielectric substance; wherein the device utilizes a boundary acoustic wave propagating along the boundary;

the electrode film is at least one of an Au alloy electrode film including Cu at a ratio of about 0.01% to about 4.8% by weight, an Au alloy electrode film including Pd at a ratio of about 0.01% to about 6.8% by weight, and an Au alloy electrode film including Ni at a ratio of about 0.01% to about 3.5% by weight.

2. The boundary acoustic wave device according to claim 1, wherein the electrode film is at least one of an Au alloy electrode film including Cu at a ratio of about 0.01% to about 1.7% by weight, an Au alloy electrode film including Pd at a ratio of about 0.01% to about 2.5% by weight, and an Au alloy electrode film including Ni at a ratio of about 0.01% to about 1.0% by weight.

3. A method for manufacturing a boundary acoustic wave device comprising:

a step of depositing an Au alloy film formed of at least one of an Au alloy including Cu at a ratio of about 0.01% to about 4.8% by weight, an Au alloy including Pd at a ratio of about 0.01% to about 20.0% by weight, and an Au alloy including Ni at a ratio of about 0.01% to about 10.5% by weight on a piezoelectric substance by one of a DC sputtering method, a RF sputtering method, and an electron beam evaporation method; and a step of laminating a dielectric substance on the piezoelectric substance on which the Au alloy film has been deposited.

* * * * *